United States Patent
Diekmann et al.

(10) Patent No.: US 9,097,414 B2
(45) Date of Patent: Aug. 4, 2015

(54) LIGHT SOURCE DEVICE ON A PRINTED CIRCUIT BOARD AND LIGHT SOURCE ARRANGEMENT COMPRISING A PLURALITY OF LIGHT SOURCE DEVICES

(75) Inventors: Karsten Diekmann, Rattenberg (DE); Steven Rossbach, Adorf (DE)

(73) Assignee: OSRAM OLED GmbH, Regensburg (DE)

( * ) Notice: Subject to any disclaimer, the term of this patent is extended or adjusted under 35 U.S.C. 154(b) by 197 days.

(21) Appl. No.: 13/820,093

(22) PCT Filed: Jul. 29, 2011

(86) PCT No.: PCT/DE2011/001533
§ 371 (c)(1),
(2), (4) Date: Feb. 28, 2013

(87) PCT Pub. No.: WO2012/028132
PCT Pub. Date: Mar. 8, 2012

(65) Prior Publication Data
US 2013/0170238 A1    Jul. 4, 2013

(51) Int. Cl.
*F21S 4/00* (2006.01)
*F21V 23/06* (2006.01)
*F21S 2/00* (2006.01)
*F21Y 101/02* (2006.01)
(Continued)

(52) U.S. Cl.
CPC ............... *F21V 23/06* (2013.01); *F21S 2/005* (2013.01); *F21Y 2101/02* (2013.01); *F21Y 2105/001* (2013.01); *H05K 1/189* (2013.01); *H05K 2201/10106* (2013.01); *H05K 2201/10356* (2013.01)

(58) Field of Classification Search
CPC ............... F21S 2/005; F21Y 2101/02; H05K 2201/10106
USPC ........................................................ 362/382
See application file for complete search history.

(56) References Cited

U.S. PATENT DOCUMENTS

| | | |
|---|---|---|
| 6,422,716 B2 | 7/2002 | Henrici et al. |
| 7,897,980 B2 | 3/2011 | Yuan et al. |
| 8,403,532 B2 | 3/2013 | Yamashita et al. |

(Continued)

FOREIGN PATENT DOCUMENTS

| | | |
|---|---|---|
| CN | 101578475 A | 11/2009 |
| DE | 298 18 609 | 2/1999 |

(Continued)

OTHER PUBLICATIONS

English language abstract of JP 2012048964 A of Mar. 8, 2012.
(Continued)

*Primary Examiner* — Anabel Ton

(57) ABSTRACT

A light source device (100), comprising: a light source (200); an input terminal (108) coupled to the light source (200) for the supply of input voltage; an output terminal (108) coupled to the light source (200) for providing an output voltage; a first bridging terminal (114) and a second bridging terminal (114); and a printed circuit board (102) coupled to the light source (200); wherein the printed circuit board (102) has at least one conductor track (402) coupled to the first bridging terminal (114) and the second bridging terminal (114) for guiding an electrical potential from the first bridging terminal (114) to the second bridging terminal (114) in a manner that bridges the light source (200).

10 Claims, 6 Drawing Sheets

(51) Int. Cl.
  *F21Y 105/00* (2006.01)
  *H05K 1/18* (2006.01)

(56) References Cited

U.S. PATENT DOCUMENTS

| 2001/0024368 | A1 | 9/2001 | Henrici et al. |
| 2008/0111470 | A1 | 5/2008 | Yuan et al. |
| 2010/0103649 | A1* | 4/2010 | Hamada ........................ 362/97.1 |

FOREIGN PATENT DOCUMENTS

| DE | 29818609 U1 | 2/1999 |
| DE | 100 12 734 | 9/2001 |
| DE | 102 61 609 | 5/2007 |
| DE | 10 2007 042 761 | 6/2008 |
| DE | 20 2010 000 890 | 5/2010 |
| JP | 2002008752 A | 1/2002 |
| JP | 2008124436 A | 5/2008 |
| JP | 2010199005 A | 9/2010 |
| JP | 2012048964 A | 3/2012 |
| WO | 2008090643 A1 | 7/2008 |

OTHER PUBLICATIONS

English translation of the office action issued in the corresponding Japanese application No. 2013-526313, dated Feb. 12, 2014, 5pages.
Chinese Office Action based on application No. 201180042111.3 (13 pages of English translation) dated Mar. 31, 2015.

* cited by examiner

LIGHT SOURCE DEVICE ON A PRINTED CIRCUIT BOARD AND LIGHT SOURCE ARRANGEMENT COMPRISING A PLURALITY OF LIGHT SOURCE DEVICES

RELATED APPLICATIONS

This is a U.S. National Phase Application under 35 USC 371 of International Application PCT/EP2011/001533 filed on Jul. 29, 2011.

This application claims the priority of German application no. 10 2010 039 956.6 filed Aug. 30, 2010, the entire content of which is hereby incorporated by reference.

FIELD OF THE INVENTION

The invention relates to a light source device and a light source arrangement.

BACKGROUND OF THE INVENTION

In order to achieve homogenous illumination from a light source device, e.g. from a flat light source also referred to below as a surface emitter (e.g. OLED light tiles (OLED: organic light-emitting diode), LED lighting panels (LED: light-emitting diode) or OLEC light sources (OLEC: organic light-emitting electrochemical cell), polydirectional contacts are generally employed. To that end, electrical terminals both on a single flat light source and on several flat light sources are necessary. These electrical terminals and their electrical return conductors to at least one common contact point require space, which, particularly as regards a flat light source, leads to an increased space requirement and total thickness. At points at which several wires must cross over separately from one another (crossover points), the wire thickness of the light source device is increased almost twofold.

A series or parallel terminal of the individual contacts on a flat light source or between several of these flat light sources was previously achieved by wires which had to be installed individually and which took up space. Return conductors have generally been installed behind the flat light sources up until now, regardless of the additional cost and thickness.

An OLED light source device is known by LEDON OLED Lighting GmbH & Co. KG, wherein the OLED is arranged on a printed circuit board (PCB).

SUMMARY OF THE INVENTION

One object of the present invention is to provide a light source device is present, which, by connecting several light source devices to a light source arrangement, allows for a reduction in the thickness of the complete light source arrangement in the supply of an electrical return conductor via one or more light source devices.

A light source device in accordance with one aspect of the invention comprises: a light source; an input terminal linked to the light source to supply an input voltage; an output terminal linked to the light source to supply an output voltage; a first bridging terminal and a second bridging terminal; and a PCB linked to the light source. The PCB comprises at least one conductor track, which is linked to the first and second bridging terminals for conducting an electrical potential from the first bridging terminal to the second bridging terminal by bypassing the light source.

In one embodiment, the input terminal comprises a first potential input terminal for the supply of a first electrical potential and a second potential input terminal for the supply of a second electrical potential.

In another embodiment, the second electrical potential is different from the first electrical potential. This is, for example, provided by a series terminal of several light source devices. Alternatively, the second electrical potential can be identical to the first electrical potential. This is, for example, provided by a parallel terminal of several light source devices.

In another embodiment, the output terminal comprises a first potential output terminal for the supply of the second electrical potential, and a second potential output terminal for the supply of the first electrical potential.

In accordance with a further development of the invention, the light source can be arranged as a flat light source—also referred to as surface emitter or surface emitter light source.

A flat light source can be also be understood as a light source in various exemplary embodiments, which generates light from a source with a surface area, in contrast with a point light source such as a light bulb. Various examples of a flat light source include LEDs, e.g. in the form of an electroluminescent source comprising many LEDs linked together, OLECs, e.g. in the form of an OLED light tile comprising many OLEDs linked together, an OLEC light source, (wherein an OLEC is understood as a an organic light-emitting electrochemical cell) e.g. for instance in the form of an OLEC light tile comprising many OLECs linked together.

The PCB can comprise one or several layers, e.g. with one or several conductor track layers (each comprising one or more conductor track layers for instance). The PCB can be set up as a flexible PCB.

The input terminal (and, where necessary, the one potential input terminal or several potential input terminals) can be arranged on the PCB in different exemplary embodiments.

Furthermore, the output terminal (and, where necessary, the one potential output terminal or several potential output terminals) can be arranged on the PCB in different exemplary embodiments.

Moreover, the first and/or second bridging terminal(s) can be arranged on the PCB in different exemplary embodiments.

A light source arrangement can be provided with a plurality of electrically linked light source devices (in series and/or parallel) in accordance with different exemplary embodiments.

BRIEF DESCRIPTION OF THE DRAWINGS

Exemplary embodiments of the invention are displayed in the figures and are described in more detail below, in which.

DETAILED DESCRIPTION OF THE DRAWINGS

Figure 1:
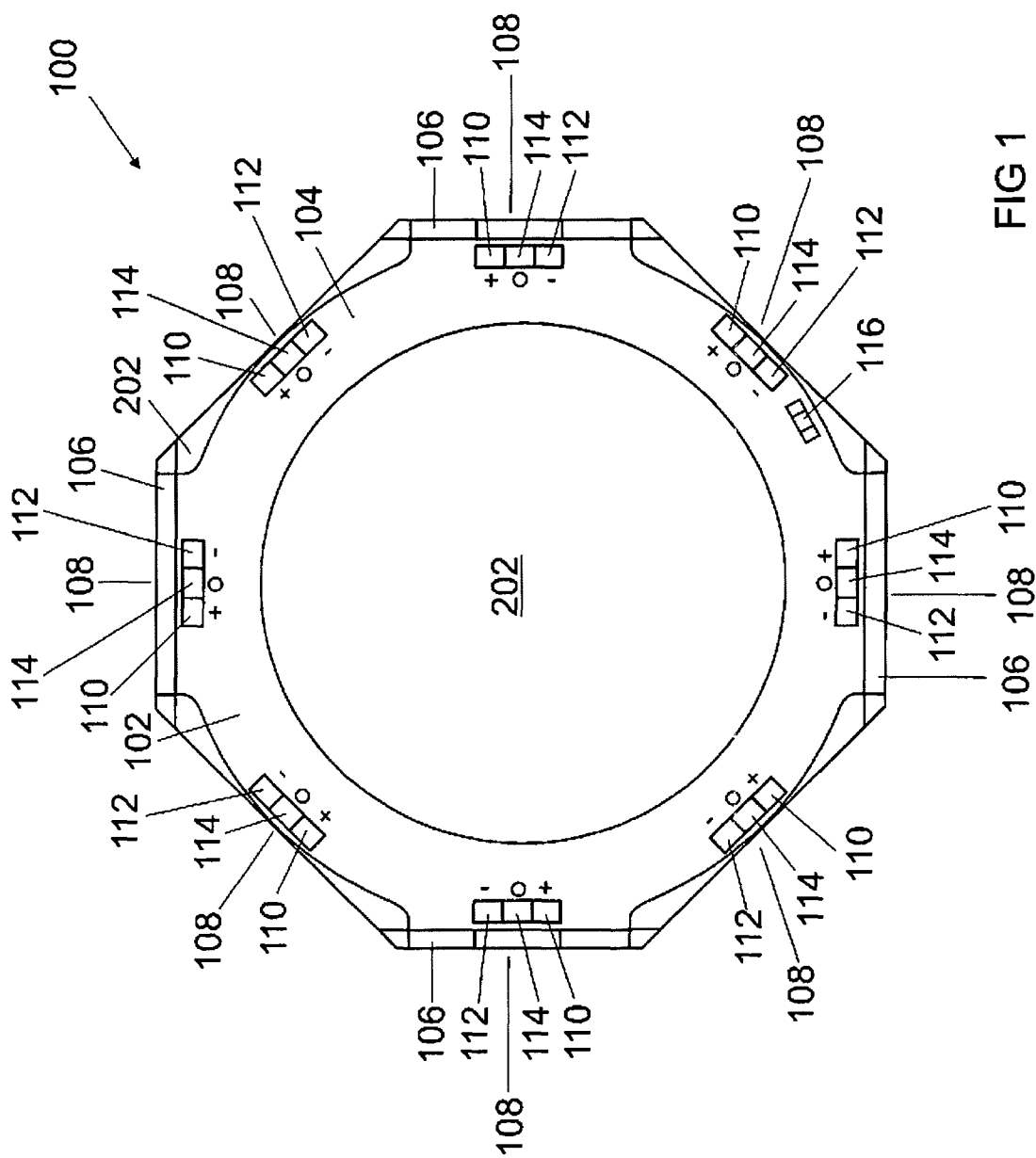
FIG. 1 shows an overhead view of a light source device according to one exemplary embodiment.

In the following detailed description, reference is made to the appended drawings, which form a part of this and in which specific embodiments are displayed for illustration purposes, in which the invention can be executed. In this regard, directional terminology such as "above", "below", "in front of", "behind", "front", "back" etc. is employed with regards to the orientation of the figure(s) described. As components of embodiments can be positioned in a number of different orientations, the directional terminology serves to illustrate the same and is in no way restrictive. It is understood that further embodiments are used and structural or logical changes can be applied, without straying from the scope of protection of the present invention. It is understood that the features of the different exemplary embodiments described herein can be used in conjunction with each other, as long as it is not specifically specified otherwise. The following detailed description is therefore not to be considered as restrictive, and the scope of protection of the invention is defined by the appended claims.

Within the scope of this description, the terms "linked", "connected" and "coupled" are used to describe both a direct or also an indirect link, a direct or indirect terminal and a direct or indirect coupling. Identical or similar elements are provided with identical reference numerals, insofar as this is expedient.

FIG. 1 shows an overhead view of a light source device 100 according to one exemplary embodiment. In various exemplary embodiments, the light source device 100 comprises at least one OLED. In other exemplary embodiments, the light source device 100 can, however, comprise several other flat light sources, e.g. one or several LEDs, e.g. in the form of an LED electroluminescent source or as one or more organic light-emitting electrochemical cells (OLECs). The light source device 100 clearly forms a light source, which can be connected to other light sources in several ways.

Figure 2:
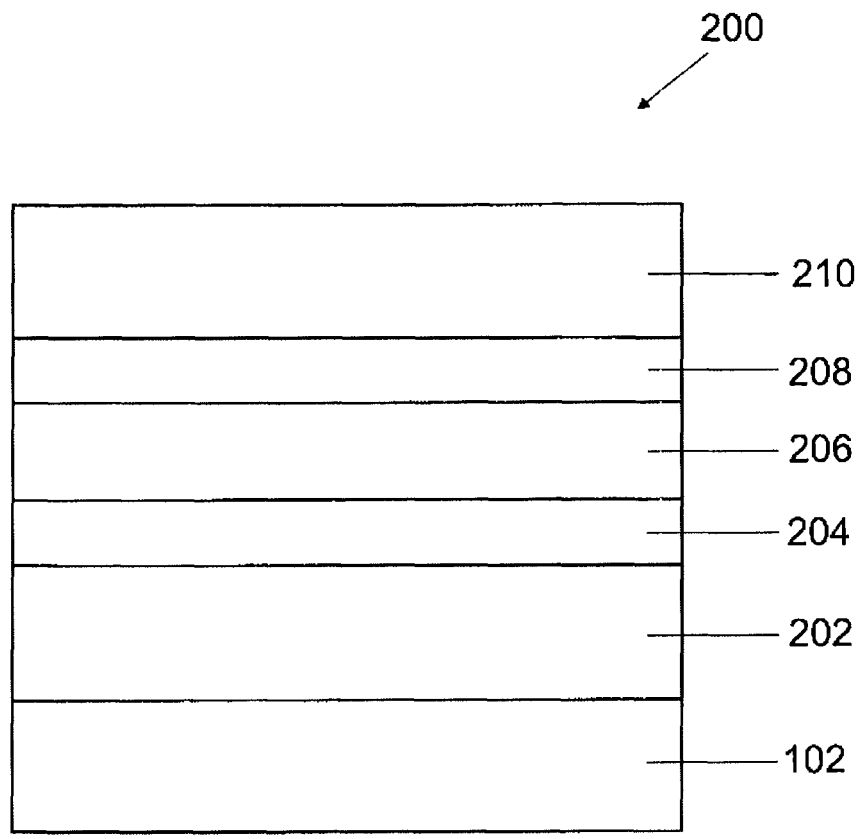
FIG. 2 shows a cross-sectional view through a light source of the light source device from FIG. 1 according to an exemplary embodiment.

FIG. 2 shows a cross-sectional view through the light source device 100 from FIG. 1 according to an exemplary embodiment with one OLED as its light source. It should be noted that a differently structured OLED can be provided in the light source device 100 in different exemplary embodiments.

In various exemplary embodiments, the light source 200, e.g. the OLED, of the light source device 100 comprises a substrate 202, as well as a first electrode 204, subsequently also referred to as the base electrode 204, which is attached to the substrate, for instance deposited.

A "substrate" 202, as it is used herein, can, for example, comprise a commonly used substrate 202 for an electrical component. The substrate 202 can be a transparent substrate 202. The substrate 202 can, however, also be a non-transparent substrate 202. For example, the substrate 202 can comprise glass, quartz, sapphire, synthetic sheet(s), metal, metal sheet(s), silicon wafer or another suitable substrate material. A metal substrate is used, for example, when the electrode coating is not arranged directly on top of it. In different embodiments, the coating is understood to be a substrate 202 to which all other coatings can subsequently be applied in the production of the light source device 100. These subsequent coatings can be, for example, the required coatings for light emissions in the light source device 100.

The substrate 202 can be a transparent substrate 202. The substrate 202 can, however, also be a non-transparent substrate 202. For example, the substrate 202 can comprise glass, quartz, sapphire, synthetic sheet(s), metal, metal sheet(s), silicon wafer or another suitable substrate material. A metal substrate can be used, for example, when the electrode coating is not arranged directly on top of it, as is described in greater detail below. In various exemplary embodiments the base electrode 204 can be, for example, an anode and be formed from indium tin oxide (ITO) for instance.

The first electrode 204 can be an anode or a cathode. The first electrode 204 can comprise hole-injection or electron-injection functions.

In various exemplary embodiments, the substrate 202 and/or the first electrode 204 can be embodied transparently.

In different exemplary embodiments, the first electrode 204 can be applied either by cathode sputtering or by thermal evaporation. In various exemplary embodiments, the first electrode 204 can comprise a layer thickness within the range of roughly 5 nm to 300 nm, for instance a layer thickness in a range from approximately 100 nm to 200 nm.

In various exemplary embodiments, one or more organic functional layers 206 are applied to the first electrode 204 for charge transfer and light generation, e.g. a fluorescent and/or phosphorescent emitter coating.

Examples of emitter materials which can be provided in an OLED in accordance with various embodiments, include organic and organometallic terminals such as derivatives of polyfluorene, polythiophene and polyphenylene (e.g. 2 or 2.5-substituted poly-p-phenylenevinylene), as well as metal complexes, e.g. iridium complexes such as blue phosphorescent FIrPic (bis(3.5-difluoro-2-(2-pyridyl)phenyl-(2-carboxypyridyl)-iridium III), green phosphorescent Ir(ppy)$_3$ (tris(2-phenylpyridine)iridium III), red phosphorescent Ru(dtb-bpy)$_3$*2(PF$_6$)(tris[4,4'-di-tert-butyl-(2,2')-bipyridine]ruthenium(III)complex), and blue fluorescent DPAVBi (4,4-Bis[4-di-p-tolylamino)styryl]biphenyl), green fluorescent TTPA (9,10-bis[N,N-di-(p-tolyl)-amino]athracene) and red fluorescent DCM2 (4-dicyanomethylene)-2-methyl-6-julolidyl-9-enyl-4H-pyrane) as non-polymer-based emitters. These non-polymer-based emitters can be separated by means, for example, of thermal evaporation. Moreover, polymer-based emitters can be used, which can be separated by means of wet-chemical processes such as spin coating for instance.

The emitter materials can be embedded in a matrix material in a suitable way.

The emitter materials of the OLED emitter coatings can be selected in such a way that, for example, the electrical component emits white light. The emitter coating can comprise several multi-colored emitter materials (e.g. blue and yellow or blue, green and red); alternatively, the emitter coating can be formed from many part-coatings, such as a blue fluorescent emitter coating, a green phosphorescent emitter coating and a red phosphorescent emitter coating. By combining different colors, light emission can result in light with a white color impression. Alternatively, provision can also be made to arrange a convertor material in the beam path of the primary emissions generated by these coatings, which at least partly absorbs the primary beam and emits a secondary beam at another wavelength, so that a white color impression is obtained from a (non-white) primary beam via a combination of primary and secondary beams.

Further organic functional coatings can be provided, which could, for example, serve to further improve the functionality and therefore the efficiency of the electrical component.

It should also be noted that provision can be made in alternative exemplary embodiments for each suitable form of light-emitting functional coatings, for instance organic functional coatings, and the invention is not restricted to a particular type of functional coating(s).

In various exemplary embodiments, a transparent electrically-conductive (e.g. metallic) base contact 208 can optionally be deposited on the one or more organic functional coatings 206, e.g. in the form of a second electrode 208. The second electrode 208 can be formed by applying a (for instance optically transparent) metallic coating with a layer thickness in the range of 5 nm to roughly 300 nm, e.g. a layer thickness of 100 nm to approximately 200 nm.

The metallic coating can comprise at least one of the following metals: aluminum, barium, indium, silver, copper, gold, magnesium, samarium, platinum, palladium, calcium and lithium, as well as combinations thereof or this metal or a compound of this metal or several of these metals, such as an alloy.

The second electrode 208 comprising a metal coating is, for example, a cathode when the first electrode 204 is an anode.

In various exemplary embodiments, the transparent metallic base electrode 208 has a 10 nm-thick silver coating, or consists of the same, wherein the transparent metallic base electrode 208 can be applied by means of thermal evaporation.

In various exemplary embodiments, the transparent metallic base electrode 208 has a 10 nm-thick silver coating, or consists of the same, wherein the transparent metallic base electrode 208 can be applied by means of thermal evaporation.

As is additionally shown in FIG. 2, an optical adaption layer 210 is applied to the free surface of the transparent electrically-conductive base contact 208 for light decoupling, e.g. by deposition or cathode sputtering.

The OLED shown in FIG. 2 for the implementation of a light source device 100 according to various exemplary embodiments is designed as a top/bottom emitter. In alternative exemplary embodiments, the light source device 100 can be arranged as a "bottom emitter" or "top emitter".

In general terms, for a top emitter or bottom emitter, one electrode of the light-emitting device can be embodied transparently in the form of the exchange electrode according to various embodiments and the other electrode can be applied reflectively. Alternatively, both electrodes can also be embodied transparently.

The term "bottom emitter", as is used herein, refers to an embodiment which is embodied transparently in respect of the substrate side of the OLED. For example, at least the substrate 202, the electrode and the electrode coating arranged between the substrate 202 and the electrode can be embodied transparently. An OLED embodied as a bottom emitter can thus emit, for example, rays produced in the organic functional coatings 208 on the substrate side 202 of the OLED.

The term "top emitter", as is used herein, refers to an embodiment for instance which is embodied transparently in respect of the side of the second OLED electrode. In particular, the electrode coating and the second electrode can be transparent. An OLED used as a top emitter can thus emit, for example, rays produced in the organic functional coatings on the side of the additional OLED electrode.

A light source device 100 embodied as a top emitter according to various exemplary embodiments, wherein the electrode coatings and the metallic coatings are provided as base contacts, can advantageously comprise a high light output and a very low ray density angle dependency. The light-emitting device according to various exemplary embodiments can advantageously be used for lights such as room lighting.

A combination of top and bottom emitter can similarly be provided in other exemplary embodiments. In such an embodiment, the light source device 100 is able to emit the light produced in the organic functional coating 208 in both directions—therefore both toward the substrate side and toward the side of the second electrode.

In a further embodiment, at least a third electrode is arranged between the electrode and the additional electrode and the electrode coating is arranged on the side of the third electrode facing the substrate 202.

The "third electrode" can also function as a sliding contact. It can therefore serve to increase charge transfer via the light source device 100 coatings, thereby improving the efficiency of the light source device 100. The third electrode can also be embodied as an ambipolar coating, an anode or a cathode.

As per the electrode and the additional electrode, the third electrode is coupled electrically.

In a further form of the light source device 100, an emitter coating and one or more additional functional coatings are contained as organic functional coatings. The additional organic functional coatings can be selected from the group consisting of hole-injection coatings, hole-transportation coatings, hole-blocking coatings, electron-injection coatings, electron-transportation coatings and electron-blocking coatings.

In various exemplary embodiments the OLED generally comprises emission characteristics essentially according to Lambert's cosine law. The term "Lambert's cosine law", as used herein, identifies the ideal emission activity of a so-called Lambert emitter. An "essential" Lambert emission characteristic, as described herein, is one wherein the emission activity is calculated according to the formula $$I(\Theta) = I_0 \cdot \cos \Theta,$$

wherein $I_0$ is the intensity in terms of a surface normal and $\Theta$ indicates the angle relative to the surface normal for a given angle, in particular for an angle between $-70°$ and $70°$ C.; for each given angle, $\Theta$ is never more than 10% away from the intensity according to the above formula, in other words $I(\Theta) = I_0 \cdot \cos \Theta \cdot x$, wherein $x = 90\% - 110\%$.

By this method, it is possible to achieve constant OLED radiance and light density in all directions, so that the OLED shines at equal brightness in all directions. It is then recommended not to alter the brightness of the OLED when it is emitted directly against the direction of sight.

In a further embodiment, the transparency of the OLED is greater than or equal to 60%. For example, the transparency can be greater than or equal to 65%. The transparency is measured by means of intensity readings, wherein the predetermined wavelength range is scanned and the light quantity passing through the light-emitting device is detected.

The term "transparency", as it is used herein, refers to the capability of the individual electronic component coatings, according to different exemplary embodiments, to allow electromagnetic waves—and particularly visible light—to pass through.

The OLED transparency according to various exemplary embodiments is generally more than 60% for at least one set wavelength, preferably 65%. For example, the transparency for at least one wavelength in a wavelength range of roughly 400 nm to 650 nm is more than 60% and, for example, more than 65%.

The OLED according to various exemplary embodiments can, in addition, comprise further functional coatings such as anti-reflection coatings, scattering layers, light-color conversion coatings and/or mechanical protective coatings. Such coatings can, for example, be arranged on the metallic coating of the exchange electrode. The functional layers can be separate for instance by means of thermal evaporation. These layers can further improve the function and efficiency of the OLED.

Furthermore, as is shown in FIG. 2, the free surface of the substrate 202 can be arranged on a PCB 102, for example on a flexible PCB. The PCB 102 can comprise a material layer or a plurality (fundamentally any number) of PCB layers. Moreover, the PCB 102 can comprise one or more (structured) electrically conductive coatings, which can comprise one or more electrically conductive (e.g. metallic) conductor tracks. The PCB can, for example, be made of plastic or be finished with synthetic materials such as polyimide.

As is described in greater detail below, the provision of a PCB with conductor tracks makes it possible to dispense with the need for a wire requiring a large amount of space for the feedback of electrical potential via the light source device 100, wherein the light source device 100 is bridged, without the returning electrical power being carried by the light source device 100 itself (and thereby by the OLED layers represented in FIG. 2, for example), instead merely by the conductor track(s) of the PCB 102 provided for the feedback.

The use of a PCB or several thin PCBs, which can also be flexible, therefore allows for the simple wiring of one or more flat light sources in different exemplary embodiments. These PCBs can be very thin in order to reduce the thickness level. Multi-layered PCBs (or PCBs with several conductor tracks) allow for crossover points to be present while taking up very little space. The series terminal of several flat light sources can be achieved by integrating one or more feedthroughs in one of these PCBs, without the need for an additional wire. Such a feedthrough is arranged in the PCB 102 via a light-conductive plane, which only needs to be contained in specific parts of the PCB 102. Other areas of the PCB can be ignored so as not to have an effect on the transparent flat light sources at these positions. The embodiment of the flexible PCB also enables the use of contacting flexible flat light sources.

In various exemplary embodiments the light source device 100 can take any shape (from overhead), e.g. a round shape (circular or elliptical) or alternatively a form with basically any number of corners and edges (e.g. polygonal such as for instance triangular, quadrangular (rectangular), pentagonal, hexagonal, heptagonal, octagonal etc.—regular or irregular).

The implementation shown in FIG. 1 comprises the light source device 100 whose overhead view is in the shape of a regular octagon.

The PCB 102 can comprise a shape which fits the shape of light source device 100, either completely or in part, e.g. in an outside section or only in sections, for instance in an outer range or boundary range of the PCB 102, wherein terminals can be provided for the supply or provision of electrical energy (as electrical power or electrical potential). In various exemplary embodiments, the PCB 102 has an annular shape, which comprises a circular area 104 and a rectangular area 106 extending outwards on some areas along the circumference of the circular area 104.

In various exemplary embodiments, the PCB 102 comprises several coupled terminals 108 to the light source 200, which can each serve as an input or output terminal according to the external contacts.

In various exemplary embodiments, each terminal 108 can comprise a first potential terminal 110 for contacting external to the device with a first electrical potential (e.g. a first potential input terminal 110 for the supply of a first electrical potential or a first potential output terminal 110 for the provision of a first electrical potential), as well as a second potential terminal 112 for contacting external to the device with a second electrical potential (which can be the same as, or different from, the first electrical potential, e.g. a second potential input terminal 112 for the supply of a second electrical potential or a second potential output terminal 112 for the provision of a second electrical potential). The first electrical potential can be more positive than the second electrical potential and is represented in FIG. 1 by "+". Accordingly, the second electrical potential is represented in FIG. 1 by "−".

Also, if eight terminals 108 are present on the PCB 102 according to FIG. 1, it should be noted that, fundamentally, any number of terminals can be used, e.g. 2, 3, 4, 5, 6, 7, 8 or more.

In various exemplary embodiments, the first potential terminal 110 can be connected to a first contact, for instance the first electrode (for instance the first electrode 204), for the instance the anode, of the light source 200 and the second potential terminal 112 can be connected to a second contact, for instance the second electrode (for instance the second electrode 208), for instance the cathode of the light source 200. In alternative exemplary embodiments, the first potential terminal 110 can be linked with the cathode of the light source 200 and the second potential terminal 112 can be linked with the anode of the light source 200.

Furthermore, according to other exemplary embodiments, each of the terminals 108 can comprise a bridging terminal 114 (also known hereafter as a transmission terminal 114). A bridging terminal 114 is, in various exemplary embodiments, not itself coupled electrically to the light source 200, but by means of one or more conductor tracks of the PCB 102 with another bridging terminal 114 of the PCB 102, wherein an electrical potential applied to a bridging terminal 114 of the PCB 102 is "looped" simply through the PCB 102 to the light source 200, and to the other bridging terminal 114, with which the bridging terminal 114 is coupled or provided externally to another light source device 102 or other electrical device. In various exemplary embodiments, the at least one conductor track acting as a returning conductor is integrated (monolithically) into the PCB 102.

It should be noted that, in various exemplary embodiments, one or more bridging terminals 114 can be provided separately independently of a terminal 108 and for instance independently of the potential terminals of the terminals 108, as are described above.

Furthermore, the PCB 102 can comprise another protective diode 116, e.g. a Schottky diode.

Figure 3:
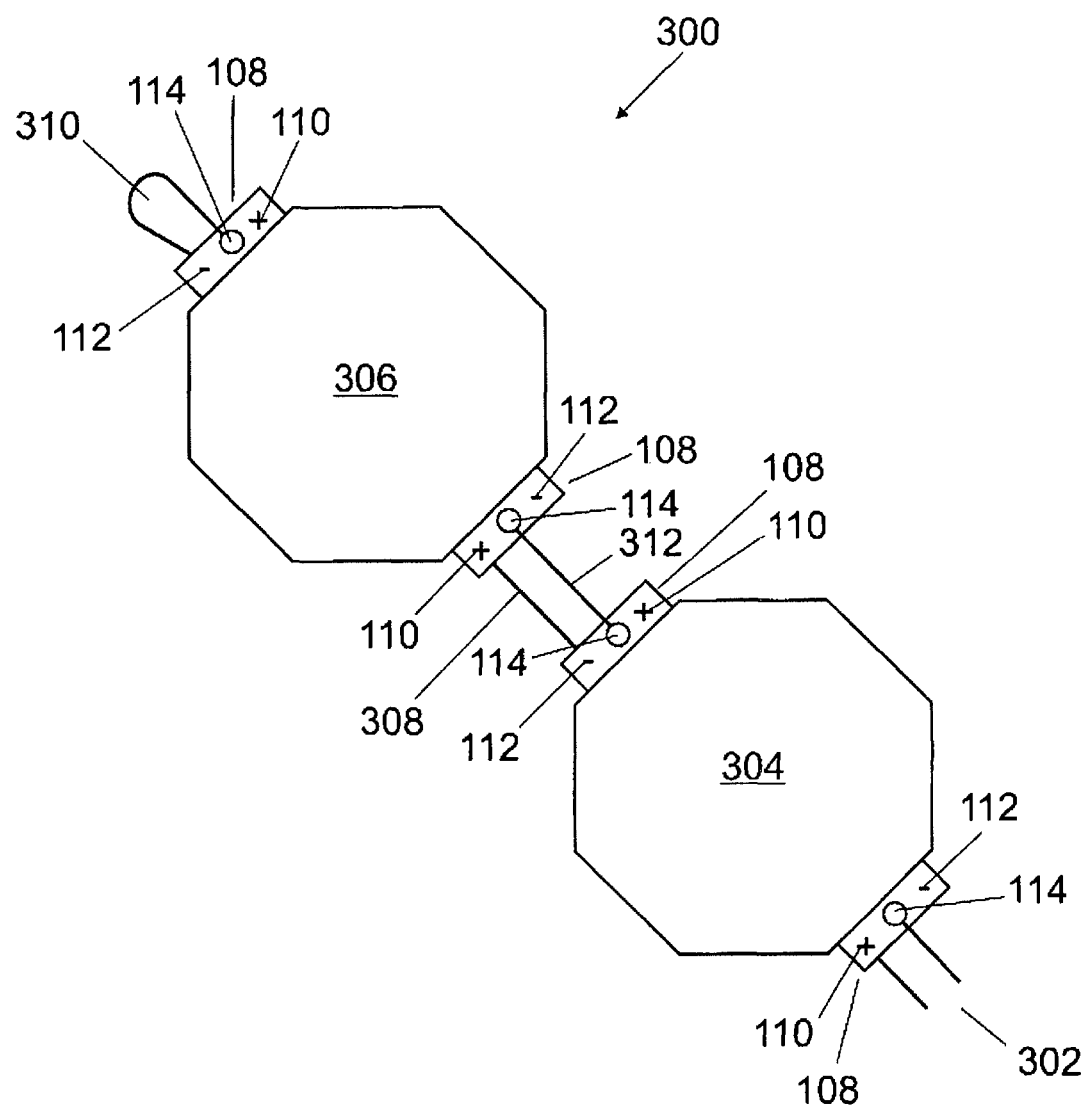
FIG. 3 shows an overhead view of a light source arrangement according to an exemplary embodiment.

FIG. 3 shows an overhead view of a light source arrangement 300 according to one exemplary embodiment with a plurality of light source devices 100. Two light source devices 100 (e.g. a first light source device 304 and second light source device 306) are shown in the light source arrangement implemented in each instance as surface emitter devices with at least one surface emitter, implemented for instance as OLEDs, although, in other exemplary embodiments, the light source arrangement 300 can comprise any number of surface emitters electrically connected in series and/or parallel, e.g. 2, 3, 4, 5 or more.

As is shown in FIG. 3, the light source arrangement 300 comprises an input terminal 302, which can be a terminal 108 of a PCB 102 of the first light source device 304, which can be used as an input light source device 304 of the light source arrangement 300.

An additional terminal 108 of the PCB 102 of the input light source device 304 serving as an output terminal is linked electrically to a terminal 108 serving as an input terminal of the PCB 102 of the second light source device 306 by means of an electrical connector 308. The connector 308 can be used for instance by means of a filament, wire or otherwise for the provision of the second electrical potential (to apply the first electrical potential "+" to the first potential input terminal 110, which is applied to the surface emitter (e.g. the OLED) of the first light source device 304 from the second potential input terminal 112 of the additional terminal, i.e. the output terminal 108 of the first light source device 304 to a terminal 108 serving as an input terminal (or, to be more exact, to the first potential input terminal 110 of the input terminal 108) of the second light source device 306. A first end of the connector 308 is coupled with the second potential input terminal 112 of the additional terminal 108 of the first light source device 304 and a second end of the connector 308 is coupled with the first potential input terminal 110 of the input terminal of the second light source device 306, e.g. clipped or soldered or adhered thereto or mechanically and electrically coupled in another suitable way.

Moreover, a shunting terminal 310 is provided, whose first end is coupled with a second potential input terminal 112 of an additional terminal of the second light source device 306 and whose second end is coupled with a bridging terminal 114 of the additional terminal of the second light source device 306, e.g. clipped or soldered or adhered thereto or mechanically and electrically coupled in another suitable way.

The electrical potential applied to the second potential input terminal 112 of the additional terminal 108 of the second light source device 306 (as a shunting terminal) is clearly conveyed back to the bridging terminal 114 of the additional terminal 108 of the second light source device 306. The bridging terminal 114 is, as is described above, linked directly to another bridging terminal 114, in this example with the bridging terminal 114 of the input terminal 108 of the second light source device 306, and clearly bypasses the light source 200 of the second light source device 306 by means of the conductor track of the PCB 102 of the second light source device 306.

The shunting terminal 310 can be linked to the second potential input terminal 112 and to the bridging terminal 114, e.g. clipped or soldered or adhered thereto or mechanically and electrically coupled in another suitable way.

Thus the electrical potential applied to the second potential input terminal 112 of the additional terminal of the second light source device 306 (minus the losses caused by the electrical resistance of the conductor track and the terminal) also rests against the bridging terminal 114 of the input terminal 108 of the second light source device 306. Thus the electrical potential applied to the second potential input terminal 112 of the additional terminal 108 of the second light source device 306 is conveyed back to its input terminal 108 via the conductor track (and not by means of a wire as in the prior art), wherein the light source, for example the OLED of the second light source device 306, is bypassed and thereby does not act as an electrical load in the feedback.

The bridging terminal 114 of the input terminal 108 of the second light source device 306 is moreover electrically connected by means of an additional connector 312 to, for example, the bridging terminal 114 of the additional terminal 108 of the first light source device 304, which, for its part, as is described above, is directly linked to another bridging terminal 114—in this example with the bridging terminal 114 of the input terminal 108 of the first light source device 304—and clearly bypasses the light source 200 of the first light source device 304 by means of the conductor track of the PCB 102 of the first light source device 304.

The additional connector 312 can be provided in various exemplary embodiments by means of a filament, a wire or otherwise. A first end of the additional connector 312 is coupled to the bridging terminal 114 of the input terminal 108 of the second light source device 306 and a second end of the additional connector 312 is coupled to the bridging terminal 114 of the input terminal 108 of the second light source device 306 of the output terminal 108 of the first light source device 304, e.g. clipped or soldered or adhered thereto or mechanically and electrically coupled in another suitable way.

Thus the electrical potential applied to the second potential input terminal 112 of the additional terminal 108 of the second light source device 306 (minus the losses caused by the electrical resistance of the conductor track and the terminal) also applies to the bridging terminal 114 of the input terminal 108 of the first light source device 304. Thus the electrical potential applied to the second potential input terminal 112 of the additional terminal 108 of the second light source device 306 is conveyed back to the input terminal 108 of the first light source device 304 via the conductor tracks (and not by means of a wire as in the prior art), to the input terminal 302 of the light source arrangement 300, wherein the light sources of all the light source devices of the (generally any) feedback path are bridged via the respective light source devices 306, e.g. the OLED of the second light source device 306, as well as the OLED of the first light source device 304, and thus do not operate as an electrical load in the feedback.

Thus a simple and space-saving possibility of providing a collective input terminal 302 of the light source arrangement 300 is achieved.

Figure 4:
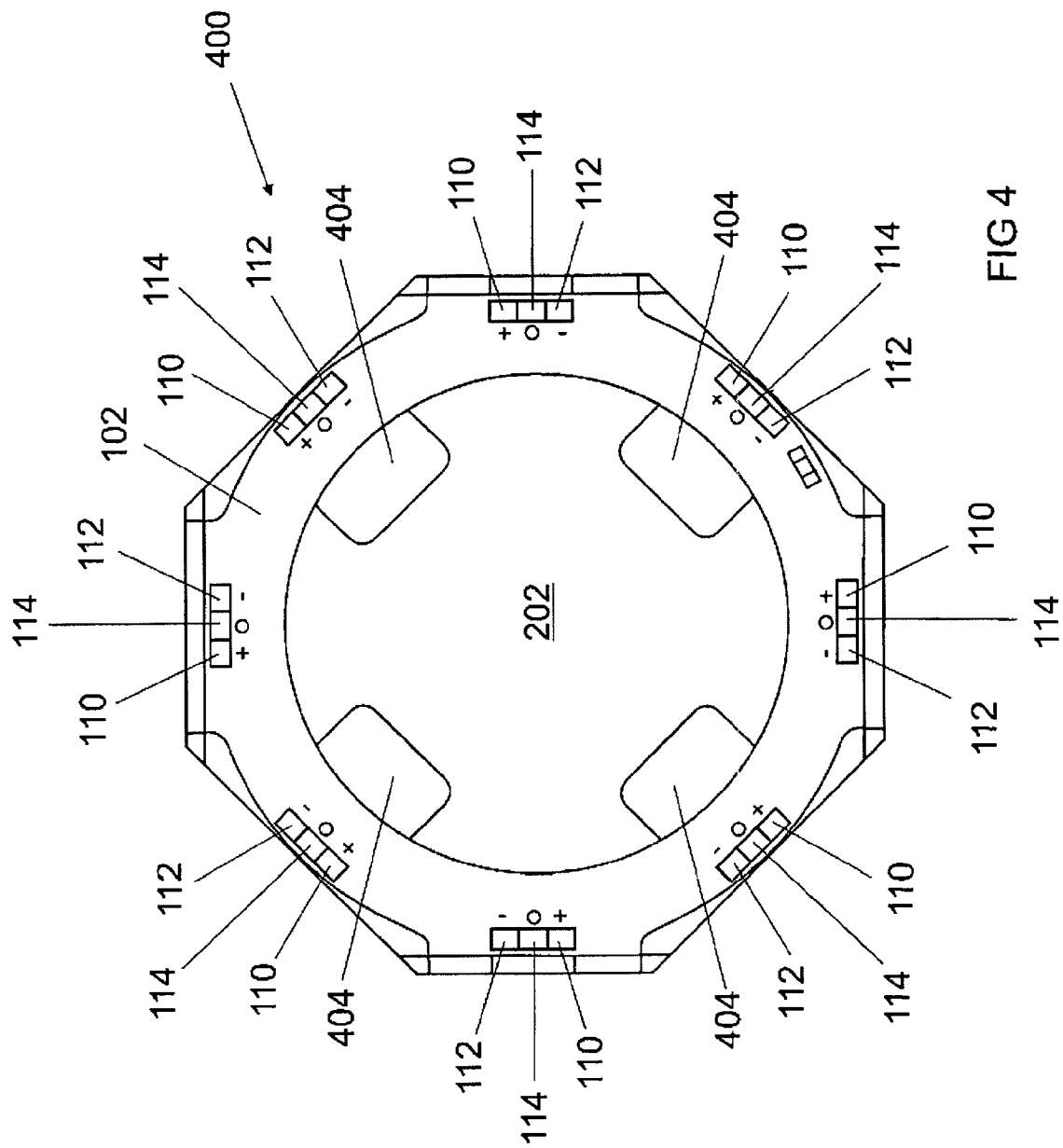
FIG. 4 shows an overhead view of a light source device according to an exemplary embodiment.

FIG. 4 depicts an overhead view of a light source device 400 according to one exemplary embodiment.

The light source device 400 displayed in FIG. 4 comprises a flexible PCB 102 with eight terminals 108, which can each be arranged as per the terminals 108 of the light source device 100 according to FIG. 1. Furthermore, the conductor track 402 integrated in the flexible PCB 102 is displayed in FIG. 4. The conductor track 402 is electrically coupled to the bridging terminals 114 of all the terminals 108 of the PCB 102, and is electrically isolated from the light source 200 and the light source device 400 and bridges the same.

Moreover, in various exemplary embodiments, the light source device 400 comprises one or more getter elements 404, consisting of getter materials or containing these for the production of e.g. acid and/or water or suchlike.

The light source device 400 can, for example, also be applied in the light source arrangement 300 instead of the light source device 100 from FIG. 1; it can, for example, comprise a flat light source, as has been described by way of example above, such as an OLED (e.g. 200) as its light source.

Figure 5:
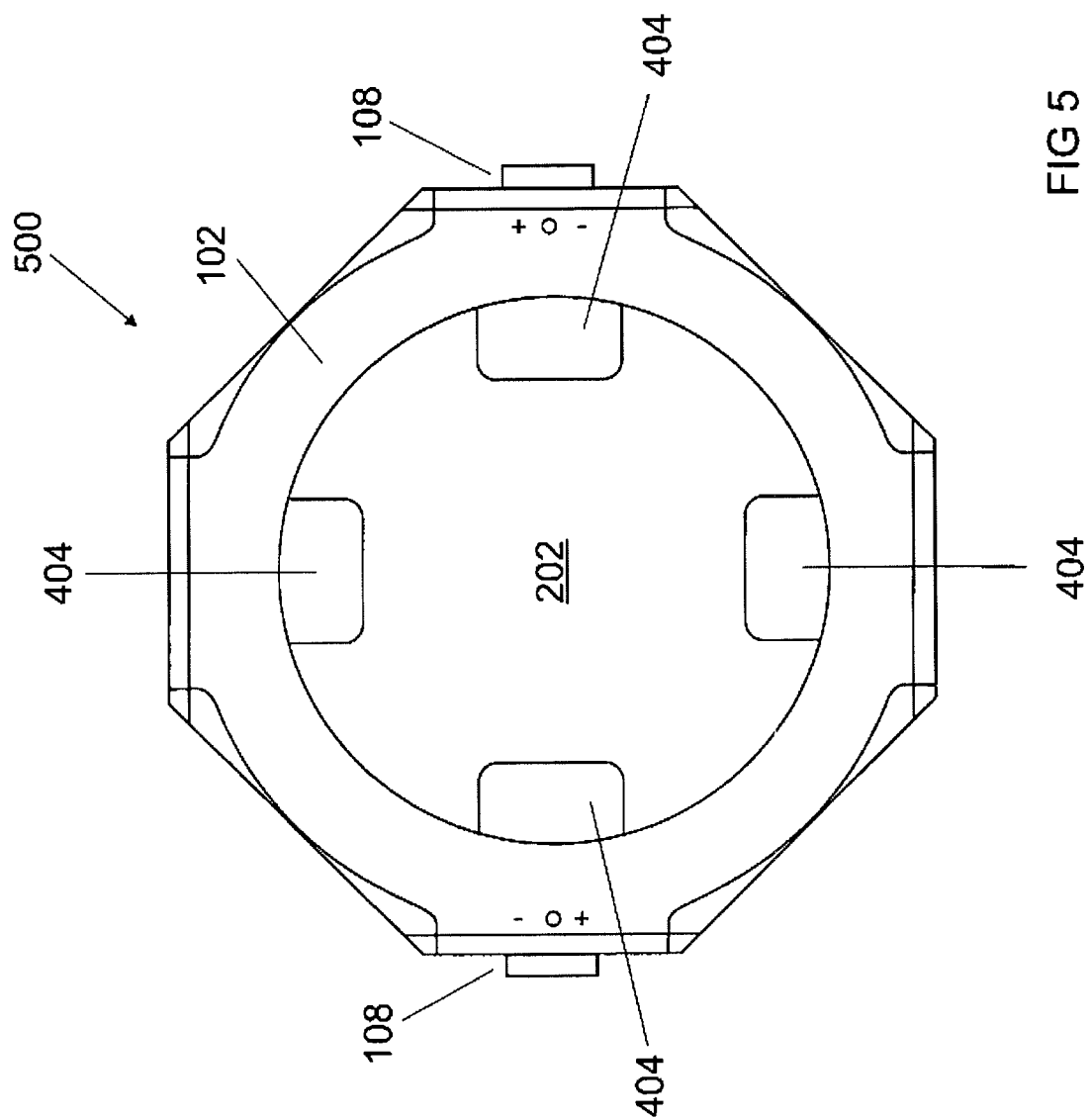
FIG. 5 shows an overhead view of a light source device according to an exemplary embodiment.

FIG. 5 depicts an overhead view of a light source device 500 according to one embodiment.

The light source device 500 displayed in FIG. 5 comprises a flexible PCB 102 with two terminals 108, each of which is arranged according to the terminals of the light source device 100 according to FIG. 1. The conductor track which is not shown in FIG. 5 is coupled electrically to the bridging terminals 114 of both terminals 108 and is electrically isolated from the light source 200 of the light source device 400 and bridges the same.

Furthermore, in various exemplary embodiments, the light source device 500 comprises one or more getter elements 404, which consist of getter materials 404 or comprise these for the production of e.g. acid and/or water or suchlike.

The light source device 500 can, for example, also be provided in the light source arrangement 300 instead of the light source device 100 from FIG. 1 and it can, for example, comprise a flat light source, as has been described by way of example above, such as an OLED (e.g. 200) as its light source.

Figure 6:
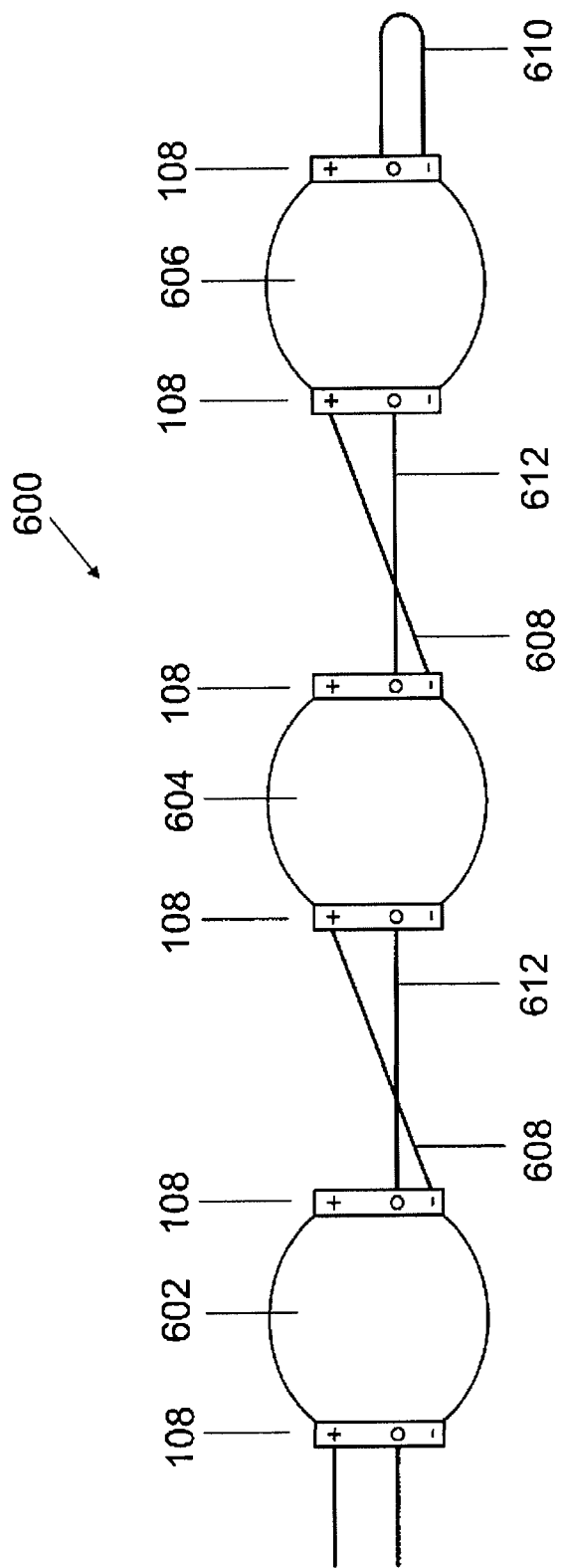
FIG. 6 shows a light source arrangement according to an exemplary embodiment.

FIG. 6 depicts a light source arrangement 600 according to one exemplary embodiment.

In this light source arrangement 600, three light source devices (e.g. a first light source device 602, a second light source device 604 and a third light source device 606) are coupled to each other in series by means of wires or filaments

608, and by means of a shunting connector 610 (connected to the end of the series circuit, e.g. to the second potential terminal 112 of the third light source device 606, as well as to the bridging terminal 114 of the third light source device 606) to the load-free feedback. The load-free feedback to the input terminal of the first light source device 602 is formed from the conductor tracks of the PCBs of the light source devices 602, 604, 606, as well as return connectors 612, 614, which are coupled to the bridging terminals 114 of the light source devices 602, 604, 606 which are each found in the return path to the input terminal of the first light source device 602. The light source devices can be arranged as per the light source devices 100, 400, 500 depicted in FIG. 1, FIG. 4 or FIG. 5; overall they can each comprise a PCB, wherein a PCB that bypasses the light source can be integrated.

In various exemplary embodiments, a very even integration of flat light sources is provided in different applications (e.g. for lighting, furniture, vehicles or consumer goods) by avoiding a thick coating behind the flat light sources.

Moreover, in various exemplary embodiments, a use of only one contact technology is possible and the mixture of several different contact technologies is not necessary.

An cable conduit in the area of an OLED with all the necessary materials can be dispensed with in various exemplary embodiments.

In various exemplary embodiments, the implementation in the PCB of a light source device as a conductive plane (e.g. in the form of one or more conductor tracks) is executed, which is only contained in specific parts of the PCB. In various exemplary embodiments, the PCB is for example arranged as a circle with an inner hollow.

Mechanical pressure on the flat light source is distributed equally across the surface by the use of a homogenous PCB according to various exemplary embodiments and does not operate selectively as, for example, in parallel circuits.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A light source device, comprising:
    a light source comprising a first electrode and a second electrode;
    an input terminal coupled at least to the first electrode for the supply of input voltage;
    an output terminal coupled at least to the second electrode for providing an output voltage;
    a first bridging terminal and a second bridging terminal; and
    a printed circuit board coupled to the light source;
    wherein the printed circuit board has at least one conductor track coupled to the first bridging terminal and the second bridging terminal for guiding an electrical potential electrically isolated from the first bridging terminal to the second bridging terminal in a manner that bridges the light source,
    wherein the input terminal comprises a first potential input terminal coupled to the first electrode for supplying a first electrical potential, and a second potential input terminal coupled to the second electrode for supplying a second electrical potential, and/or
    wherein the output terminal comprises a first potential output terminal coupled to the first electrode for providing a first electrical potential, and a second potential output terminal coupled to the second electrode for providing a second electrical potential.

2. The light source device as claimed in claim 1, wherein the light source is set up as a flat light source.

3. The light source device as claimed in claim 2, wherein the flat light source is set up as at least one of the following flat light sources: a light-emitting diode, an organic light-emitting diode, an OLEC light source.

4. The light source device as claimed in claim 1, wherein the printed circuit board is arranged as a flexible printed circuit board.

5. The light source device as claimed in claim 1, wherein the input terminal is positioned on the printed circuit board.

6. The light source device as claimed in claim 1, wherein the output terminal is arranged on the printed circuit board.

7. The light source device as claimed in claim 1, wherein the first bridging terminal and/or the second bridging terminal is/are positioned on the printed circuit board.

8. The light source arrangement with a plurality of light source devices coupled together electrically as claimed in claim 1.

9. The light source device as claimed in claim 1, wherein the light source device comprises a substrate having a free surface wherein the free surface is arranged on the printed circuit board.

10. The light source device as claimed in claim 1, wherein the light source device comprises one or more organic functional layers wherein the one or more organic functional layers are formed on the first electrode and the second electrode is formed on the one or more organic functional layers, or
    wherein the one or more organic functional layers are formed on the second electrode and the first electrode is formed on the one or more organic functional layers.

* * * * *